US008571161B2

(12) United States Patent
Levantino et al.

(10) Patent No.: US 8,571,161 B2
(45) Date of Patent: Oct. 29, 2013

(54) ELECTRONIC DEVICE FOR GENERATING A FRACTIONAL FREQUENCY

(75) Inventors: Salvatore Levantino, Milan (IT); Carlo Samori, Milan (IT); Marco Zanuso, Verona (IT)

(73) Assignee: Politechnico di Milano, Milan (IT)

( * ) Notice: Subject to any disclaimer, the term of this patent is extended or adjusted under 35 U.S.C. 154(b) by 202 days.

(21) Appl. No.: 13/147,527

(22) PCT Filed: Feb. 3, 2010

(86) PCT No.: PCT/EP2010/051265
§ 371 (c)(1),
(2), (4) Date: Aug. 2, 2011

(87) PCT Pub. No.: WO2010/097273
PCT Pub. Date: Sep. 2, 2010

(65) Prior Publication Data
US 2011/0286510 A1     Nov. 24, 2011

(30) Foreign Application Priority Data
Feb. 27, 2009   (IT) .............................. MI2009A0289

(51) Int. Cl.
*H03D 3/24*      (2006.01)
(52) U.S. Cl.
USPC ........... 375/376; 375/316; 375/295; 375/354; 375/371; 375/374; 375/375
(58) Field of Classification Search
USPC ......... 375/316, 295, 354, 371, 373, 374, 375, 375/376
See application file for complete search history.

(56) References Cited

U.S. PATENT DOCUMENTS

| | | | |
|---|---|---|---|
| 6,441,667 B1 | 8/2002 | Boerstler et al. | |
| 7,746,178 B1 * | 6/2010 | Humphreys et al. | 331/1 A |
| 2006/0001494 A1 * | 1/2006 | Garlepp et al. | 331/2 |
| 2006/0078079 A1 * | 4/2006 | Lu | 375/376 |
| 2007/0041486 A1 * | 2/2007 | Shin | 375/376 |
| 2008/0265998 A1 | 10/2008 | Wood | |
| 2009/0074127 A1 * | 3/2009 | Liu | 375/376 |
| 2009/0103675 A1 * | 4/2009 | Yousefi Moghaddam et al. | 375/376 |

OTHER PUBLICATIONS

Chan-Hong Park, et al., "A 1.8-GHz Self-Calibrated Phase-Locked Loop with Precise I/Q Matching", IEEE Journal of Solid-State Circuits, May 2001, pp. 777-783, vol. 36, No. 5.

* cited by examiner

*Primary Examiner* — Siu Lee
(74) *Attorney, Agent, or Firm* — Sughrue Mion, PLLC

(57) ABSTRACT

It is described an electronic device for generating a fractional synthesized frequency. The device comprises a multi-phase controlled oscillator configured to generate, from a control signal, a plurality of signals phase-shifted each other and comprises a phase detector configured to receive a selected signal from the plurality of phase-shifted signals, to receive a reference signal and to measure a difference between a phase of the selected signal and a phase of the reference signal. The electronic device further comprises control means for estimating, from the measured phase difference, a phase error affecting the generation of at least one of the plurality of phase-shifted signals, and for generating a corrected measure of the phase difference taking into account the estimated phase error, the corrected measure being used to provide the control signal.

18 Claims, 7 Drawing Sheets

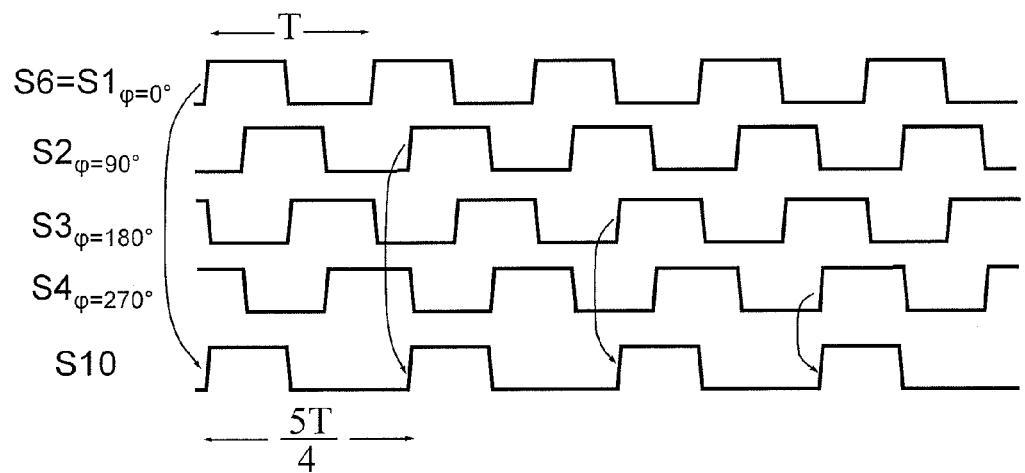
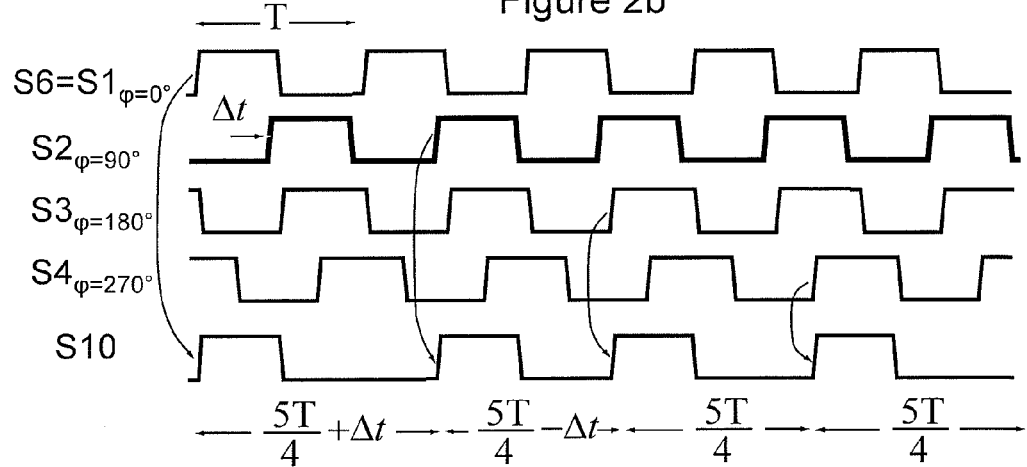

_US 8,571,161 B2_

ELECTRONIC DEVICE FOR GENERATING A FRACTIONAL FREQUENCY

CROSS REFERENCE TO RELATED APPLICATIONS

This application is a National Stage of International Application No. PCT/EP2010/051265 filed Feb. 3, 2010, claiming priority based on Italian Patent Application No. MI2009A000289, filed Feb. 27, 2009, the contents of all of which are incorporated herein by reference in their entirety.

BACKGROUND

1. Technical Field

The present disclosure generally relates to an electronic device for generating a fractional frequency. More particularly, the present disclosure relates to a phase-switching fractional frequency synthesizer with reduction of the spurious fractional modulations.

2. Description of the Related Art

Electronic circuits are known, for generating an output signal at a desired frequency (referred to hereinafter as a "synthesized frequency") which is a multiple of an input reference frequency: such devices are commonly indicated with frequency synthesizers.

Fractional frequency synthesizers are a particular class wherein the synthesized frequency is not an integer multiple of the reference frequency, but it is a fractional multiple of the reference frequency: for example, the synthesized frequency is 100, 25 times the reference frequency.

FIG. 1 schematically shows a possible implementation of a fractional frequency synthesizer 1 according to the prior art, implemented with a phase-locked loop. In particular, the fractional frequency synthesizer is of the phase-switching type: the controlled oscillator 12 generates a periodic signal S6 at a variable frequency and from the signal a plurality of signals, phase-shifted each other and at the same frequency f1 as the signal S6, are obtained, by means of a multi-phase generator 13; for example, FIG. 1 shows that four signals are obtained $S1_{\phi=0°}$, $S2_{\phi=90°}$, $S3_{\phi=180°}$, $S4_{\phi=270°}$, phase-shifted by $\phi=0°$, $\phi=90°$, $\phi=180°$, $\phi=270°$ with respect to signal S6 generated by the controlled oscillator 12. Subsequently, by means of the parallel-serial phase selector 14, at least part of the signals phase-shifted by $\phi=0°$, $\phi=90°$, $\phi=180°$, $\phi=270°$ are cyclically selected, by means of the logic circuit 16, according to the desired (fractional) synthesized frequency $f_1$. In this way a synthesized signal S6 at a frequency $f_1$ can be obtained, which is a fractional multiple of the reference frequency $f_0$ of the signal S11, i.e. $f_1=(N+k/4)*f_0$, wherein N is the integer division factor of the frequency divider 15 and k is an integer number comprised between 0 and 3: in this case the minimum change in the synthesized frequency f1, which can be obtained with k=1, is equal to $f_0/4$.

For example, FIG. 2a shows the case wherein the division factor of the frequency divider 15 is N=1 and the sequence of the selected phase-shifted signals is {S1, S2, S3, S4}, cyclically repeated. In this example the signal S10 has a fractional period equal to 5/4 times the period of the signal S6, i.e. it has a frequency equal to 4/5 times the frequency of S6.

A phase-switching fractional frequency synthesizer has the disadvantage that it generates not only a signal at the desired synthesized frequency, but it also adds spectral components at undesired frequencies (indicated with fractional spurious frequencies) near the synthesized frequency. This is due to the fact that it's not possible to obtain the plurality of signals phase-shifted each other with an absolute accuracy, but there is some inaccuracy between the phase-shifted signal edges. For example, FIG. 2a shows the case wherein four signals S1, S2, S3, S4 are generated phase-shifted by $\phi=0°$, $\phi=90°$, $\phi=180°$, $\phi=270°$ in the ideal case and FIG. 2b in the real case: it can be observed that in the real case there is a shift by $\Delta t$ of the edge of the pulses of the 90° phase-shifted signal. Consequently, signal S10 generated in the real case has a fundamental component (i.e. the desired one) at a frequency equal to 4/5 times the frequency of S6, but it also has an undesired phase shift keying at a frequency equal to 1/5 times the frequency of S6.

More generally, if the sequence of cyclic selection (also referred to as "rotation sequence") of the phase-shifted signals S1, S2, S3, S4 is chosen so that the frequency of S10 is 1/(N+k/M) times the frequency of S6 (wherein N and M are integer numbers and wherein k=0, 1, ... M−1), the signal S10 has an undesired phase shift keying at a frequency equal to 1/(N+k/M) times the frequency of S6.

It can occur that the fractional spurious frequencies get closer to the synthesized frequency when the required resolution increases (i.e. in case wherein the fractional part is smaller, i.e. when M increases) and therefore they cannot be easily eliminated by a filter.

Several techniques are known for filtering the fractional spurious frequencies, for example the document IEEE Journal of Solid-State Circuitis, vol. 36, n. 5, May 2001, pp. 777-783 by Chan-Hong Park et al. and the U.S. Pat. No. 7,298,809 e U.S. Pat. No. 7,298,790. These prior arts try to obtain a calibration of the plurality of phases, in order to keep the edges of the phase-shifted signals aligned with respect to the edges of a reference signal of the phase-locked loop and have the disadvantage that they require a plurality of additional loop filters and a plurality of tunable phase-shifters, which excessively increase the synthesizer complexity and the area occupation, especially in case of an implementation into an integrated circuit.

BRIEF SUMMARY

One embodiment of the present disclosure relates to an electronic device for generating a fractional frequency. The electronic device comprises a multi-phase controlled oscillator adapted to generate, from a control signal, a plurality of signals phase-shifted each other. The electronic device further comprises a phase detector adapted to receive a selected signal from the plurality of phase-shifted signals, to receive a reference signal and to measure a difference between a phase of the selected signal and a phase of the reference signal. The electronic device further comprises control means for estimating, from the measured phase difference, a phase error affecting the generation of at least one of the plurality of phase-shifted signals, and for generating a corrected measure of the phase difference taking into account the estimated phase error, the corrected measure being used to provide the control signal.

The Applicant has recognized that the electronic device according to the present disclosure can reduce the fractional spurious frequencies. Moreover it has the advantage that it is simple to implement, it requires no changes of the multi-phase generator and of the controlled oscillator and it allows the real-time reduction of the fractional spurious frequencies.

In accordance with another aspect of the present disclosure, the phase detector and the control means of the electronic device are digital and the control means include a plurality of accumulators for providing a plurality of phase error signals indicating the estimation of the phase error affecting the generation of the at least one of the plurality of phase-shifted signals. The control means further include a first plurality of adders/subtractors for receiving the measured phase difference and the plurality of estimated phase error signals and for providing a plurality of difference signals calculated by subtracting the plurality of estimated phase error signals from the measured phase difference. The control means further include a plurality of parallel-to-serial selectors for receiving the plurality of difference signals and for providing a plurality of corrected phase difference signals selected from the plurality of difference signals according to a selection signal. The control means further include a parallel-to-serial phase selector for receiving the plurality of corrected phase difference signals and for providing the corrected measure of the phase difference selected from the plurality of corrected phase difference signals according to the selection signal.

One embodiment of the present disclosure is a radio-receiver which includes the electronic device described above.

One embodiment of the present disclosure is a radio transmitter which includes the electronic device described above.

BRIEF DESCRIPTION OF THE SEVERAL VIEWS OF THE DRAWINGS

Further characteristics and the advantages of the disclosure will result from the following description of a preferred embodiment and variants thereof, provided as a way of example with reference to the attached drawings, wherein:

FIG. 2 schematically shows the waveforms of a multi-phase generator in the ideal case and in the real case;

DETAILED DESCRIPTION

Figure 1:
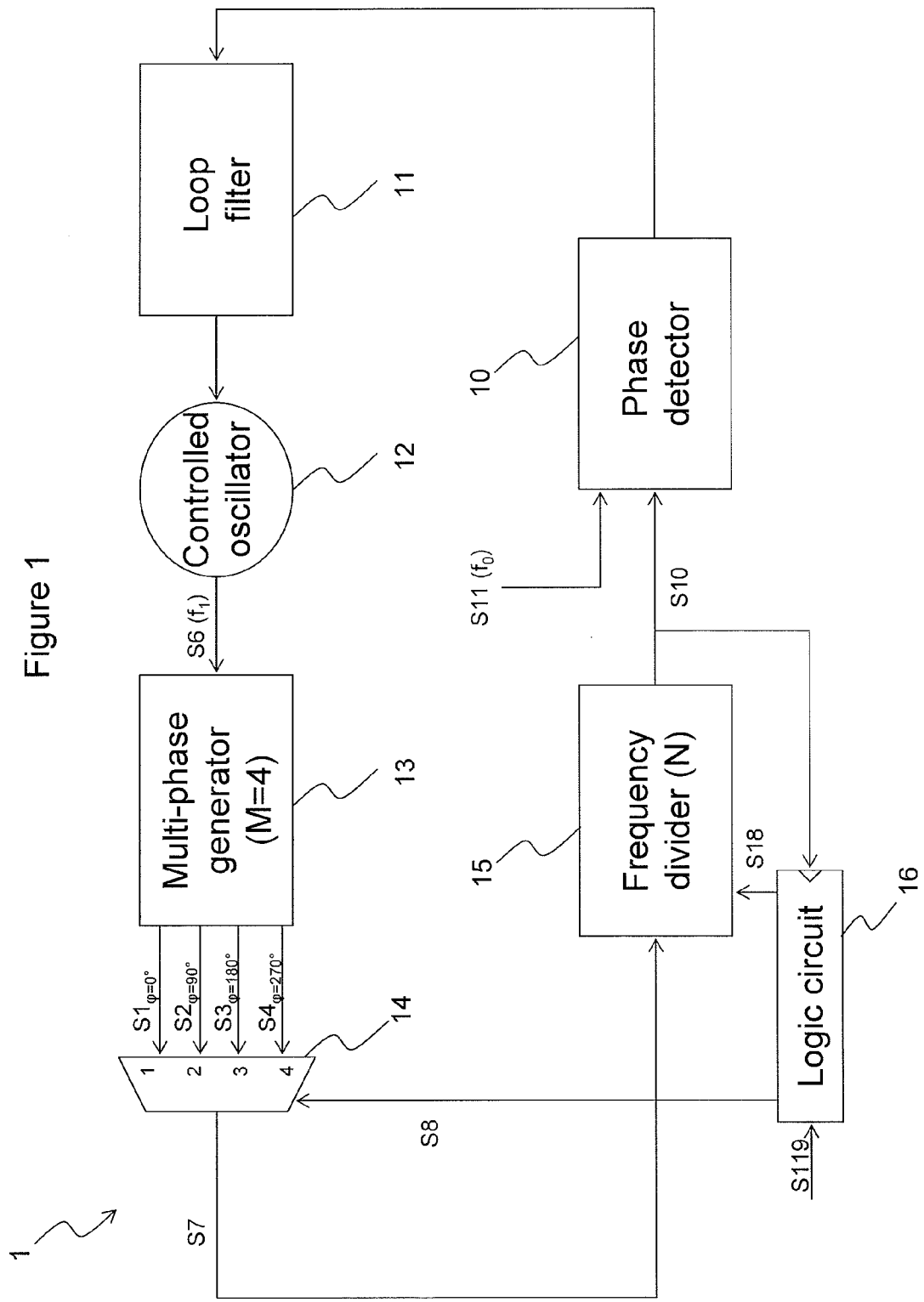
FIG. 1 schematically shows a fractional frequency synthesizer according to the prior art.
Figure 3:
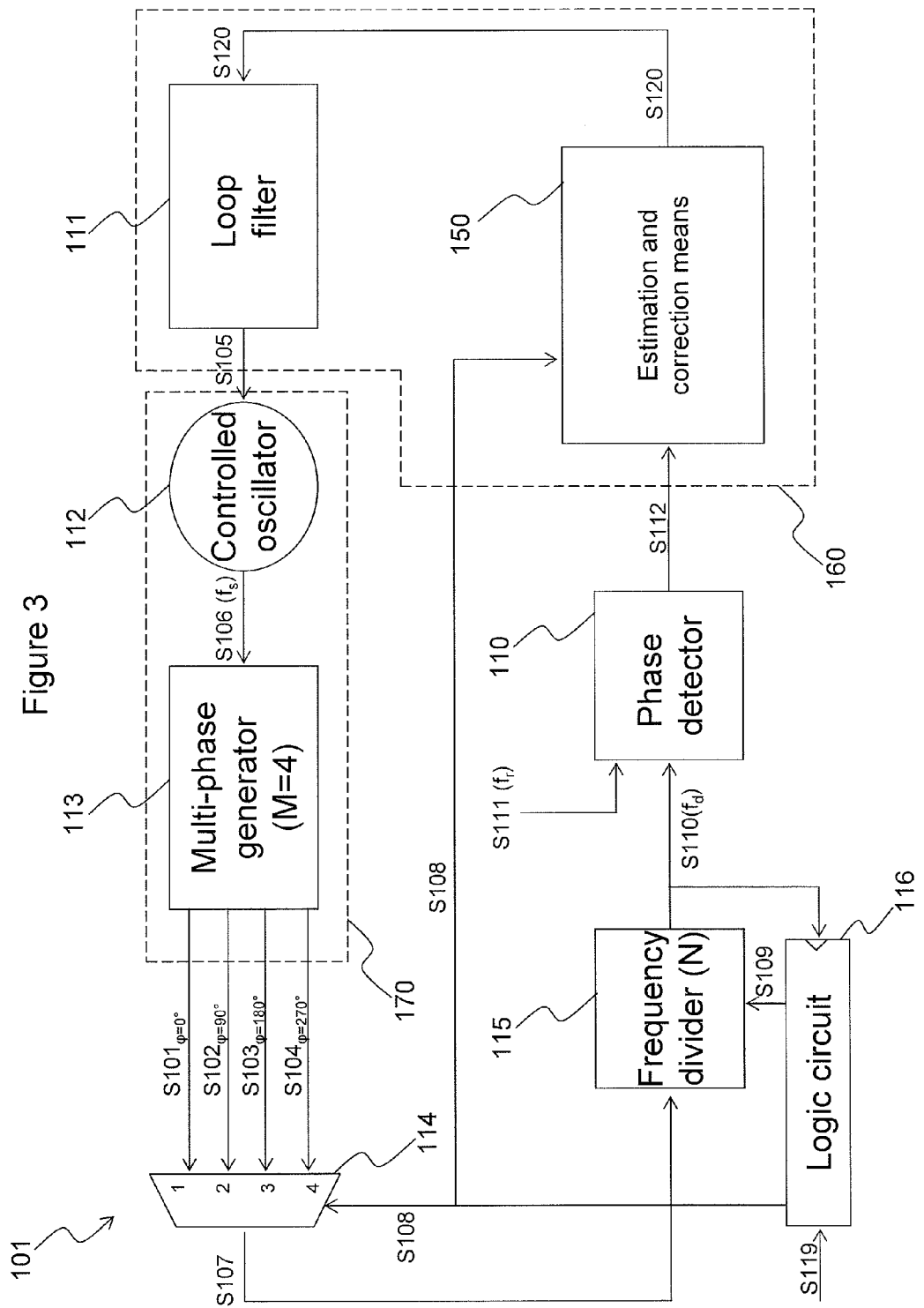
FIG. 3 schematically shows a fractional frequency synthesizer according to an embodiment of the disclosure.

With reference to FIG. 3, a frequency synthesizer 101 according to an embodiment of the disclosure is shown.

The frequency synthesizer 101 is implemented with a phase-locked loop and it comprises:
a multi-phase controlled oscillator 170;
a parallel/serial phase selector 114;
a frequency divider 115;
a logic circuit 116;
a phase detector 110;
control means 160.

The control means 160 comprise estimation and correction means 150 and a loop filter 111.

The multi-phase controlled oscillator 170 comprises an input terminal connected to the output terminal of the control means 160 and comprises four output terminals. The multi-phase controlled oscillator 170 is configured to receive at the input terminal a control signal S105 and it is configured to generate, at the 4 output terminals, a first, a second, a third and a fourth signal S101, S102, S103, S104 respectively phase-shifted each other by 90° and at the same synthesized frequency $f_s$ as the synthesized signal S106. In particular, the first signal S101 is phase-shifted by 0° with respect to the synthesized signal S106, the second signal S102 is phase-shifted by 90° with respect to the synthesized signal S106 (therefore S102 is phase-shifted by 90° with respect to S101), the third signal S103 is phase-shifted by 180° with respect to the synthesized signal S106 (therefore S103 is phase-shifted by 90° with respect to S102) and the fourth signal S104 is phase-shifted by 270° with respect to the synthesized signal S106 (therefore S104 is phase-shifted by 90° with respect to S103), as schematically shown in FIG. 3 with $S101_{\phi=0°}$, $S102_{\phi=90°}$, $S103_{\phi=180°}$, $S106_{\phi=270°}$. The pattern of the phase-shifted signals S101, S102, S103, S104 is the same as the signals S1, S2, S3, S4 shown in FIG. 2b.

The multi-phase controlled oscillator 170 can be implemented with a single component (indicated with 170 in FIG. 3) or it can implemented with 2 components, as indicated in FIG. 3. In particular, the multi-phase controlled oscillator 170 comprises a controlled oscillator 112 and a multi-phase generator 113.

The controlled oscillator 112 comprises an input terminal and an output terminal; the controlled oscillator 112 is configured to receive at its input terminal the controlled signal S105 and it is configured to generate at the output terminal a synthesized signal S106 at the synthesized frequency $f_s$ variable as a function of the control signal S105.

The multi-phase generator 113, the parallel/serial phase selector 114 and the frequency divider 115 have the function to generate a signal S110 at a frequency $f_d$ equal to the synthesized frequency $f_s$ of the synthesized signal S106 divided by a fractional number (N+k/M), wherein N is an integer number, M is an integer equal to the number of phase-shifted signals S101, S102, S103, S104 (M=4 in the example in FIG. 3) and k is an integer number comprised between 0 and M−1 (k=1 in the example of FIG. 2).

The multi-phase generator 113 comprises an input terminal connected to the output terminal of the controlled oscillator 12 and it comprises 4 output terminals; the multi-phase generator 113 is configured to receive, at the input terminal, the synthesized signal S106 at a variable frequency and it is configured to generate, at the 4 output terminals, the first, the second, the third and the fourth signals S101, S102, S103, S104 respectively, phase-shifted by 90° each other and at the same synthesized frequency $f_s$ of the synthesized signal S106. In particular, the first signal S101 is phase-shifted by 0° with respect to the synthesized signal S106, the second signal S102 is phase-shifted by 90° with respect to the synthesized signal S106 (therefore S102 is phase-shifted by 90° with respect to S101), the third signal S103 is phase-shifted by 180° with respect to the synthesized signal S106 (therefore S103 is phase-shifted by 90° with respect to S102) and the fourth signal S104 is phase-shifted by 270° with respect to the synthesized signal S106 (therefore S104 is phase-shifted by 90° with respect to S103), as schematically shown in FIG. 3 with $S101_{\phi=0°}$, $S102_{\phi=90°}$, $S103_{\phi=180°}$, $S104_{\phi=270°}$. The pattern of the phase-shifted signals S101, S102, S103, S104 is the same as the signals S1, S2, S3, S4, shown in FIG. 2b.

For sake of simplicity FIG. 3 shows the multi-phase generator 113 configured to generate 4 phase-shifted signals, respectively, at the 4 output terminals, but more in general the multi-phase generator 113 is configured to generate a plurality M of signals phase-shifted each other (i.e. M is the number of phases) on a plurality M of output terminals respectively (i.e. the output terminals can be any integer number M higher than or equal to 2: FIG. 3 shows, for sake of simplicity, the case wherein M is equal to 4), wherein the frequency of the plurality M of the phase-shifted signals is equal to the synthesized frequency $f_3$ of the synthesized signal S106.

The parallel/serial phase selector 114 comprises 4 input terminals connected to the 4 output terminals of the multi-phase generator 113 respectively, comprises a selection input terminal connected to an output terminal of the logic circuit 116 and comprises an output terminal; the parallel/serial phase selector 114 is configured to receive, at 4 input terminals, the 4 signals S101, S102, S103, S104 respectively, phase-shifted each other, is configured to receive, at the selection input terminal, the selection signal S108 (as it will be explained in more detail below) and it is configured to generate at the output terminal a selected signal S107 obtained by means of the cyclic selection of at least part of the phase-shifted signals S101, S102, S103, S104 according to the desired particular (fractional) frequency $f_s$ of the synthesized signal S106.

For sake of simplicity, FIG. 3 shows the parallel/serial phase selector 114 configured to receive the 4 phase-shifted signals at the 4 input terminals respectively, but, more in general, the parallel/serial phase selector 114 is configured to receive a plurality M (equal to the number of phases) of signals phase-shifted each other on a plurality M of input terminals respectively (i.e. the input terminals can be any integer number M higher than or equal to 2: for sake of simplicity, FIG. 3 shows the case wherein M is equal to 4), wherein, therefore, the number of input terminals of the parallel/serial phase selector 114 is equal to the output terminals of the multi-phase generator 113.

Figure 5:
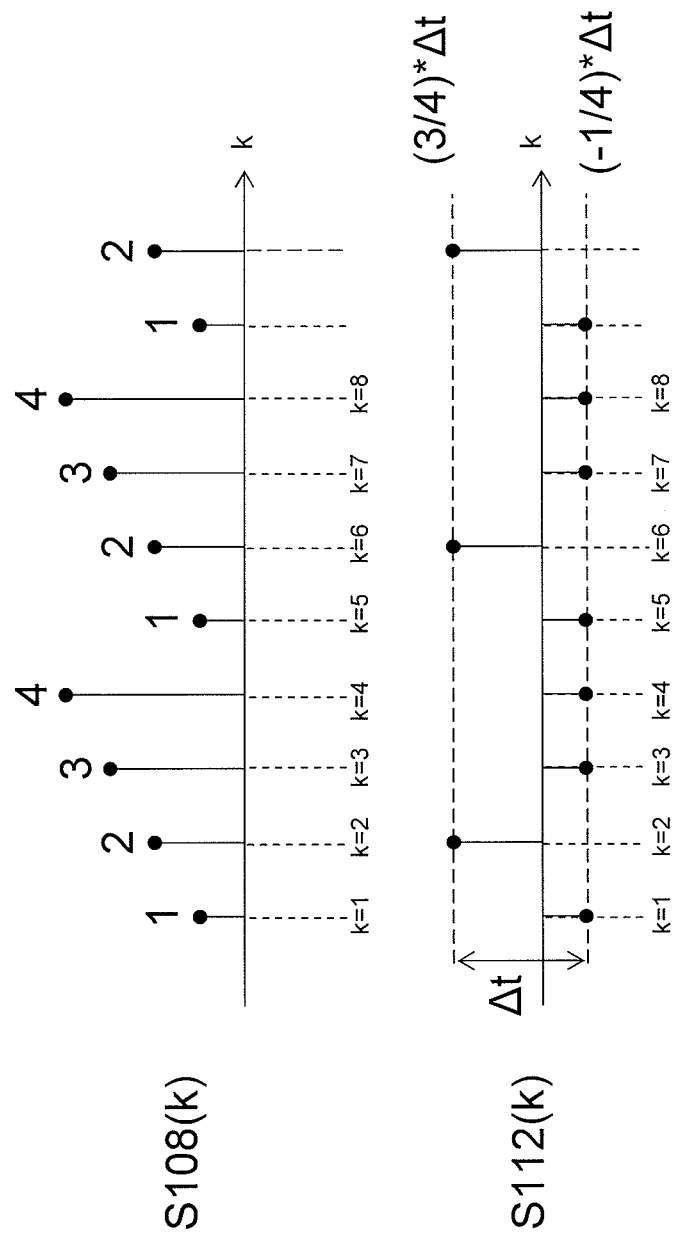
FIG. 5 schematically shows an exemplary pattern of some signals of the frequency synthesizer according to the embodiment of the disclosure.

The logic circuit 116 comprises a first input terminal at the output of the frequency divider 115, comprises a second input terminal, comprises a first output terminal connected to the second input terminal of the frequency divider 115 and comprises a second output terminal connected to the selection input terminal of the parallel/serial phase selector 114. The logic circuit 116 is configured to receive at the first input terminal the divided signal S110, it is configured to receive at the second input terminal an input configuration signal S119 indicating the particular desired fractional frequency $f_s$ for the synthesized signal S106 (for example, if we want $f_s=100,25*f_r$, S119=100,25), it is configured to generate at the first output terminal the output configuration signal S109 and it is configured to generate at the second output terminal, according to the value of the input configuration signal S119, the selection signal S108 indicating the selection sequence of the phase-shifted signals S101, S102, S103, S104; for example, FIG. 5 shows the pattern of the samples of the selection signals S108 with values 1, 2, 3, 4 (cyclically repeated), which correspond to a selection sequence of the phase-shifted signals S101, S102, S103, S104 equal to {S101, S102, S103, S104} (cyclically repeated). Moreover, the logic circuit 116 has the function of providing to the frequency divider 115 the output configuration signal S109 indicating the value of the division factor N of the frequency divider 115 (N is also indicated with the module of the frequency divider 115), as a function of the value of the input configuration signal S119.

The frequency divider 115 comprises a first input terminal connected to the output terminal of the parallel/serial phase selector 114, comprises a second input terminal connected to the first output of the logic circuit 116 and comprises an output terminal; the frequency divider 115 is configured to receive at the first input terminal the selected signal S107 and it is configured to generate at the output terminal the divided signal S110 at the frequency $f_d$. For example, the frequency divider 115 is configured to generate at the output terminal the divided signal S110 with a switching edge (for example, a rising edge) after counting N switching edges (for example, rising edges) of the selected signal S107 received at the first input terminal, wherein the module N is tunable as a function of the value of the output configuration signal S109 and depends on the particular desired frequency $f_3$ of the synthesized signal S106.

Therefore the set including the multi-phase generator 113, the parallel/serial phase selector 114 and the frequency divider 115 have the function of generating the divided signal S110 and a frequency $f_d$ equal to the frequency $f_s$ of the synthesized signal S106 divided by the fractional (N+k/M), wherein N is an integer number, M is an integer number equal to the number of the phase-shifted signals (M=4 in the example of FIG. 3, wherein we have four phase-shifted signals S101, S102, S103, S104) and k is an integer number comprised between 0 and M−1 (k=1 in the example in FIG. 2). Viceversa, the frequency $f_s$ of the synthesized signal S106 is a fractional multiple of the frequency $f_r$ of the reference signal S111: in particular, $f_3=(N+k/M)*f_r$.

The phase detector 110 comprises a first input terminal connected to the output terminal of the frequency divider 115, comprises a second input terminal and comprises an output terminal. The phase detector 110 is configured to receive at the first input terminal the divided signal S110 at the frequency $f_d$ and at the second input terminal the reference signal S111 at the frequency $f_r$, it is configured to measure the difference between the divided signal S110 phase and the reference signal S111 phase and it is configured to generate at the output terminal a phase difference signal S112 indicating the measure of the difference between the phase of the divided signal S110 and the phase of the reference signal S111.

The reference signal S111 at the frequency $f_r$ can be generated, for example, by a quartz oscillator.

The estimation and correction means 150 comprise a first input terminal connected to the output terminal of the phase detector 110, comprise a second input terminal connected to an output terminal of the logic circuit 116 and comprise an output terminal; the estimation and correction means 150 are configured to receive at the first input terminal the measured phase difference signal S112, are configured to receive at the second input terminal the selection signal S108 and are configured to generate at the output terminal a corrected phase difference signal S120, as it will be explained in more detail below.

The loop filter 111 comprises an input terminal connected to the output terminal of the estimation and correction means 150 and comprises an output terminal connected to the input terminal of the controlled oscillator 112; the loop filter 11 is configured to receive at the input terminal the corrected phase difference signal S120, which is used to provide the control signal S105 at the output terminal.

In one embodiment, the phase detector 110 is an analog-to-digital converter, for example a time-digital converter, i.e. a device configured to receive in input two pulse signals and provide an output digital signal indicating the time delay between the pulses of the input signals.

FIG. 5 shows an exemplary pattern of the measured phase difference signal S112(k) generated by the time-digital converter according to the selection signal S108(k), in the case wherein there is a phase error Δt in the generation of the rising edge of the pulses of the second phase-shifted signal S102 (as shown in FIG. 2b). The first, second, third and fourth samples of the measured phase difference signal S112(k) represent the delay of the pulses of the divided signal S110 with respect to the pulses of the reference signal S111, in case the logic circuit 116 is configured to generate a sequence of selection of the signals S101, S102, S103, S104 equal to {S101, S102, S103, S104}; this sequence of the first four samples of S112 (k) is periodically repeated for the samples subsequent to the fourth one. Since it is supposed that there is a phase error Δt in generating the rising edge of the pulses of the second phase-shifted signal S102, it may be noted that the phase difference signal S112(k) is not always null, but it is periodic with a frequency equal to $f_r/4$. In particular, the second sample (at the instant k=2) of the measured phase difference signal S112 has the value (¾)*Δt different from the value (−¼)*Δt of the first, third and fourth samples (at the instants k=1, k=3, k=4 respectively). In fact the second sample represents the delay of the rising edge of the pulses of the second phase-shifted signal S102, which was affected by a shift of Δt (i.e. a phase-shift of the second phase-shifted signal S102), while the first, the third the fourth samples represent the delay of the rising edge of the pulses of the signals S101, S102, S103, S104 respectively, (which were not affected by any phase-shift). Moreover, it is to be observed that the average value of the measured phase difference signal S112(k) is zero because the frequency synthesizer 101 is implemented with a phase-locked loop (which is a feedback system), but the measured phase difference signal S112(k) has instant values which are not zero because a phase error Δt is present in the generation of the second phase-shifted signal S102. In particular, FIG. 5 shows that the measured phase difference signal S112 is (¾)*Δt when the logic circuit 116 is configured to generate the selection signal S108 indicating the selection of the second phase-shifted signal S102 and it is (−¼)*Δt when the logic circuit 116 is configured to generate the selection signal S108 indicating the selection of phase-shifted signals S102, S103, S104, wherein Δt is the phase error in the generation of the rising edge of the pulses of the second phase-shifted signal S102.

Figure 4:
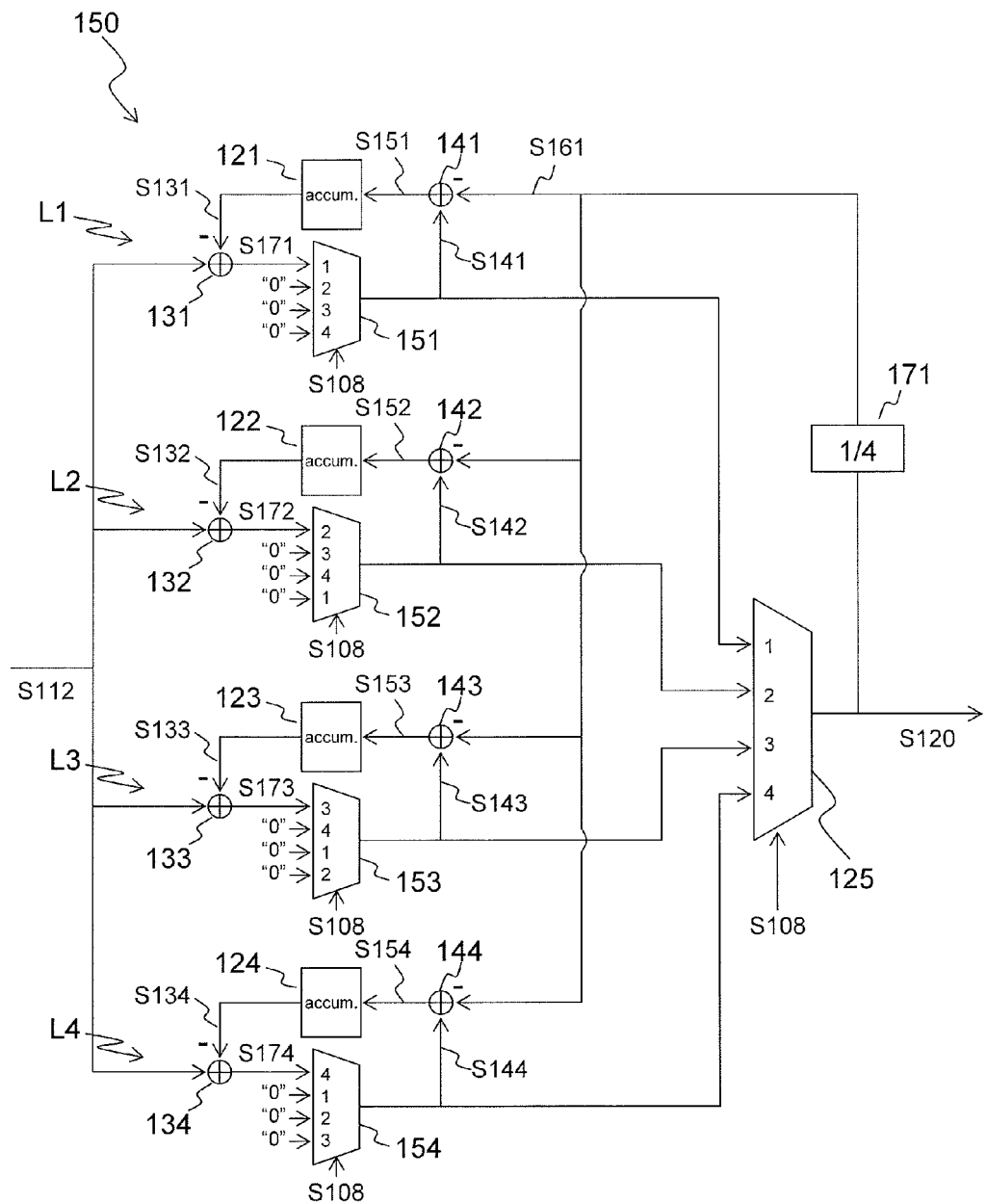
FIG. 4 schematically shows an exemplary embodiment of the estimation and correction means according to the disclosure.

In one embodiment, the estimation and correction means 150 are implemented digitally and are implemented as schematically shown in FIG. 4.

In particular, the estimation and correction means 150 comprise:
four estimation and correction lines L1, L2, L3, L4;
a parallel/serial phase selector 125 with four data input terminals, a control input terminal and an output terminal;
a block 171 with gain ¼.

More in general, in case the multi-phase generator 113 is configured to generate a plurality M of phase-shifted signals, the estimation and correction means 150 comprise a plurality M of estimation and correction lines (i.e. the number of estimation and correction lines is equal to the number of phase-shifted signals), a parallel/serial phase selector with M inputs (i.e. the number of inputs of the parallel/serial phase selector is equal to the number of phase-shifted signals) and a gain block 1/M.

Each of the estimation and correction lines L1, L2, L3, L4 comprises:
an adder/subtractor node, indicated in FIG. 4 with 131 for line L1, 132 for line L2, 133 for line L3, 134 for line L4;
a parallel/serial selector, indicated in FIG. 4 with 151 for line L1, 152 for line L2, 153 for line L3, 154 for line 14;
a digital accumulator, indicated in FIG. 4 with 121 for line 11, 122 for line L2, 123 for line L3, 124 for line L4;
an adder/subtractor node, indicated in FIG. 4 with 141 for line L1, 142 for line L2, 143 for line L3, 144 for line L4.

The first estimation and correction line L1 has the function of generating a signal S141 indicating the corrected phase difference of the first, second, third, fourth phase-shifted signals S101, S102, S103, S104: the signal S141 will be referred to hereinafter as the first corrected phase difference.

The second estimation and correction line L2 has the function of generating a signal S142 indicating the corrected phase difference of the first, second, third phase-shifted signals S101, S102, S103, S104: the signal S142 will be referred to hereinafter as the second corrected phase difference.

The third estimation and correction line L3 has the function of generating a signal S143 indicating the corrected phase difference of the first, second, third, fourth phase-shifted signals S101, S102, S103, S104: the signal S143 will be referred to hereinafter as the third corrected phase difference.

The fourth estimation and correction line L4 has the function of generating a signal S144 indicating the corrected phase difference of the first, second, third, fourth phase-shifted signals S101, S102, S103, S104: the signal S144 will be referred to hereinafter as the fourth corrected phase difference.

The digital accumulators 121, 122, 123, 124 have the function of estimating the phase error in the generation of the first phase-shifted signal S101, of the second phase-shifted signal S102, of the third phase-shifted signal S103 and of the fourth phase-shifted signal S104. Moreover, the digital accumulators 121, 122, 123, 124 have the function of storing and providing at the respective output terminal the signal S131 indicating the value of a first estimation of the phase error in the generation of the first, second, third, fourth phase-shifted signal S101, S102, S103, S104, the signal S132 indicating the value of a second estimation of the phase error in the generation of the first, second, third, fourth phase-shifted signal S101, S102, S103, S104, the signal S133 indicating the value of a third estimation of the phase error in the generation of the first, second, third, fourth phase-shifted signal S101, S102, S103, S104, the signal S134 indicating the value of a fourth estimation of the phase error in the generation of the first, second, third, fourth phase-shifted signal S101, S102, S103, S104, respectively, as it will be explained in more detail below.

Figure 6:
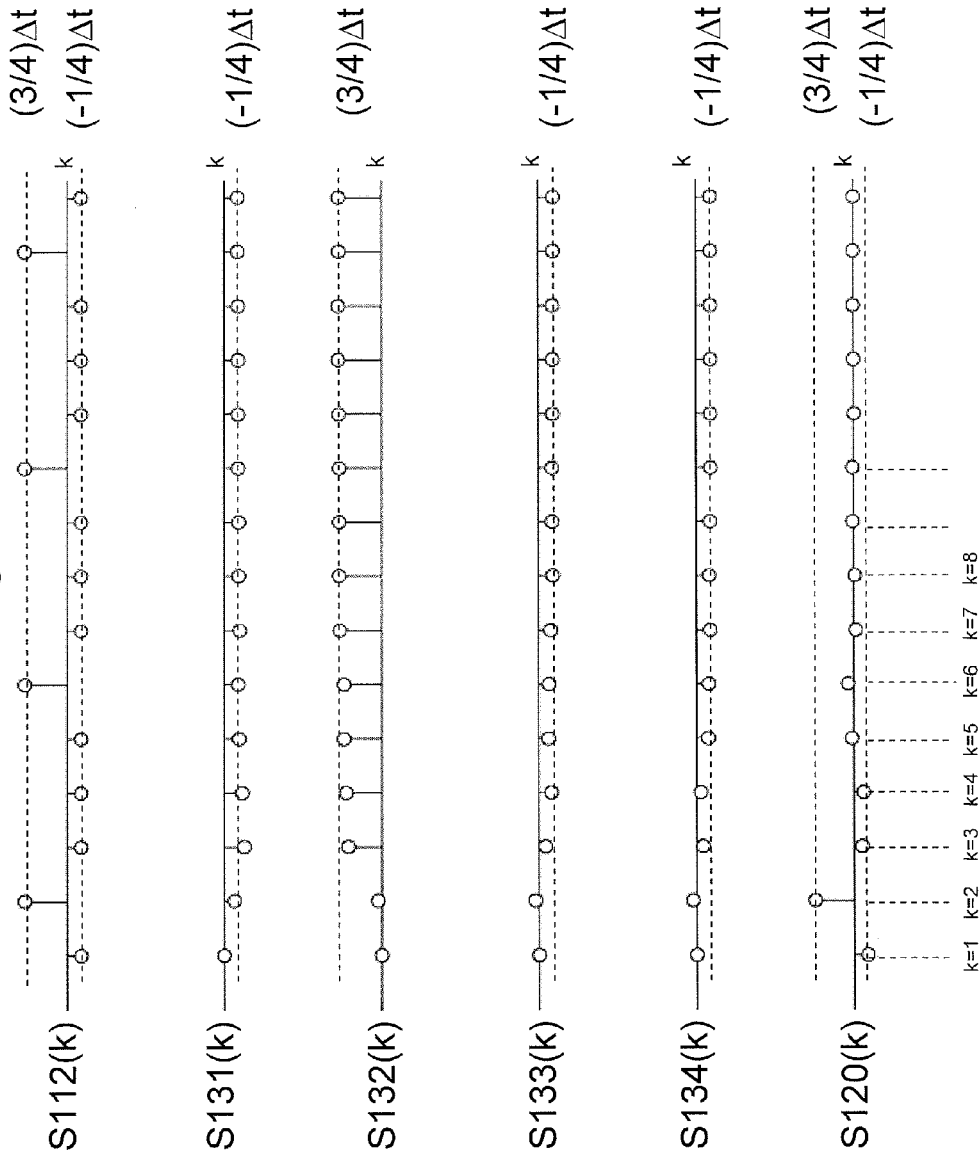
FIG. 6 schematically shows an exemplary pattern of some signals of the estimation and correction means according to the disclosure.

FIG. 6 shows an exemplary pattern of the samples of the measured phase difference S112 of the first, second, third, fourth estimation of the phase error S131, S132, S133, S134 and of the corrected phase difference S120, in the case wherein there is a phase error Δt in the generation of the rising edge of the pulses of the second phase-shifted signal S102 (as shown in FIG. 2b) and in the case wherein the signals S131, S132, S133, S134 are digital (and are indicated with S131(k), S132(k), S133(k), S134(k), wherein on the axis of abscissas the discrete time k is indicated and on the axis of ordinates the samples of S131(k), S132(k), S133(k), S134(k) are indicated). As it has been explained above, the signal measured phase difference S112(k) includes samples with a value equal to (¾)*Δt and a value equal to (−¼)*Δt. Signals S131(k), S132(k), S133(k), S134(k) have a first transient phase and subsequently a steady phase wherein they converge towards constant steady values which depend on the phase error Δt in the generation of the rising edge of the pulses of the second phase-shifted signal S102: in particular, the first estimation of the phase error S131(k) converges to the steady value (−¼)*Δt, the second estimation of the phase error S132(k) converges to the steady value (¾)*Δt, the third estimation of the phase error S133(k) converges to the steady value (−¼)*Δt and the fourth estimation of the phase error S134(k) converges to the steady value (−¼)*Δt. It can be seen that also the pattern of the corrected phase difference signal S120(k) has a first transient phase and subsequently a steady phase, wherein the values of the samples decrease to zero: the estimation and correction means 150 are therefore configured to eliminate (or at least reduce) the phase errors in generating the phase-shifted signals, avoiding (or reducing) the phase errors from propagating in the phase-locked loop.

Generally, the steady values of the estimation of the first, second, third and fourth error phase can be different each other, because there can be different shifts of the edges of the pulses of the phase-shifted signals S101, S102, S103, S104.

Each of the four adder/subtractor nodes 131, 132, 133, 134 has two input terminals and an output terminal and are configured to provide a first, a second, a third and a fourth difference signal S171, S172, S173, S174 respectively on the output terminal calculated as the difference between the signals at the two input terminals; the adder/subtractor nodes 131, 132, 133, 134 have the function of correcting the measured phase difference S112 taking into account the values of the first, second, third, fourth estimations of the phase error S131, S132, S133, S134 (as it will be explained in more detail below) and this is obtained by subtracting the first, second, third, fourth estimation of the phase error S131, S132, S133, S134 from the measured phase difference S112. In particular:

node 131 is configured to receive the measured phase difference S112 and the first estimation of the phase error S131 stored into the first accumulator 121 and it is configured to provide at the output the first difference signal S171 calculated as the difference between the measured phase difference S112 and the first estimation of the phase error S131;

node 132 is configured to receive the measured phase difference S112 and the second estimation of the phase error S132 stored into the second accumulator 122 and it is configured to provide at the output the second difference signal S172 calculated as the difference between the measured phase difference S112 and the second estimation of the phase error S132;

node 133 is configured to receive the measured phase difference S112 and the third estimation of the phase error S133 stored into the third accumulator 123 and it is configured to provide at the output the third difference signal S173 calculated as the difference between the measured phase difference S112 and the third estimation of the phase error S133;

node 134 is configured to receive the measured phase difference S112 and the fourth estimation of the phase error S134 stored into the fourth accumulator 124 and it is configured to provide at the output the fourth difference signal S174 calculated as the difference between the measured phase difference S112 and the fourth estimation of the phase error S134.

Each of the parallel/serial selectors 151, 152, 153, 154 comprises four input data terminals, a control input terminal and an output terminal.

The first parallel/serial selector 151 is configured to receive at the input data terminals the first difference signal S171 and values equal to zero, it is configured to receive at the control input terminal the selection signal S108 and it is configured to generate at the output terminal the first corrected phase difference signal S141 equal to the first difference signal S171 when the logic circuit 116 is configured to generate the selection signal S108 indicating the selection of the first phase-shifted signal S101 (for example, when the signal S108 is equal to 1, as schematically shown in FIG. 4, wherein the value 1 was indicated at the input of the signal S171) and it is configured to generate at the output terminal the first corrected phase difference signal S141 equal to zero when the logic circuit 116 is configured to generate the selection signal S108 indicating the selection of the second, third and fourth phase-shifted signal S102, S103, S104 (for example, when the signal S108 is equal to 2, 3, 4, as schematically shown in FIG. 4, wherein the values 2, 3, 4 were indicated at the inputs equal to zero).

The second parallel/serial selector 152 is configured to receive at the input data terminals the second difference signal S172 and values equal to zero, it is configured to receive at the control input terminal the selection signal S108 and it is configured to generate at the output terminal the second corrected phase difference signal S142 equal to the second difference signal S172 when the logic circuit 116 is configured to generate the selection signal S108 indicating the selection of the second phase-shifted signal S102 (for example, when the signal S108 is equal to 2, as schematically shown in FIG. 4, wherein the value 2 was indicated at the input of the signal S172) and it is configured to generate at the output terminal the second corrected phase difference signal S142 equal to zero when the logic circuit 116 is configured to generate the selection signal S108 indicating the selection of the first, third and fourth phase-shifted signals S101, S103, S104 (for example, when the signal S108 is equal to 3, 4, 1, as schematically shown in FIG. 4, wherein the values 3, 4, 1 were indicated at the inputs equal to zero).

The third parallel/serial selector 153 is configured to receive at the input data terminals the third difference signal S173 and values equal to zero, it is configured to receive at the control input terminal the selection signal S108 and it is configured to generate at the output terminal the third corrected phase difference signal S143 equal to the third difference signal S173 when the logic circuit 116 is configured to generate the selection signal S108 indicating the selection of the third phase-shifted signal S103 (for example, when the signal S108 is equal to 3, as schematically shown in FIG. 4, wherein the value 3 was indicated at the input of the signal S173) and it is configured to generate at the output terminal the third corrected phase difference signal S143 equal to zero when the logic circuit 116 is configured to generate the selection signal S108 indicating the selection of the first, second and fourth phase-shifted signals S101, S102, S104 (for example, when the signal S108 is equal to 4, 1, 2, as schematically shown in FIG. 4, wherein the values 4, 1, 2 were indicated at the inputs equal to zero).

The fourth parallel/serial selector 154 is configured to receive at the input data terminals the fourth difference signal S174 and values equal to zero, it is configured to receive at the control input terminal the selection signal S108 and it is configured to generate at the output terminal the fourth corrected phase difference signal S144 equal to the fourth difference signal S174 when the logic circuit 116 is configured to generate the selection signal S108 indicating the selection of the fourth phase-shifted signal S104 (for example, when the signal S108 is equal to 4, as schematically shown in FIG. 4, wherein the value 4 was indicated at the input of the signal S174) and it is configured to generate at the output terminal the fourth corrected phase difference signal S144 equal to zero when the logic circuit 116 is configured to generate the selection signal S108 indicating the selection of the first, second, third phase-shifted signals S101, S102, S103 (for example, when the signal S108 is equal to 1, 2, 3 as schematically shown in FIG. 4, wherein the values 1, 2, 3 were indicated at the inputs equal to zero).

The parallel/serial phase selector 125 comprises four input data terminals connected to the four outputs of the parallel/serial selectors 151, 152, 153, 154 respectively, comprises a control input terminal and comprises an output terminal which coincides with the output terminal of the estimation and correction means 150. The parallel/serial phase selector 125 is configured to receive:

at the first input terminal the first corrected phase difference signal S141;

at the second input terminal the second corrected phase difference signal S142;

at the third input terminal the third corrected phase difference signal S143;

at the fourth input terminal the fourth corrected phase difference signal S144;

and the parallel/serial phase selector 125 is configured to generate at the output terminal the corrected phase difference signal S120 as a function of the selection signal S108 at the control input terminal. In particular, the parallel/serial phase selector 125 is configured to generate at the output terminal:

the first corrected phase difference signal S141 when the logic circuit 116 is configured to generate the selection signal S108 indicating the selection of the first phase-shifted signal S101 (for example, when the signal S108 is equal to 1, as schematically shown in FIG. 4, wherein the value 1 was indicated at the first input of the selector 125);

the second corrected phase difference signal S142 when the logic circuit 116 is configured to generate the selection signal S108 indicating the selection of the second phase-shifted signal S102 (for example, when the signal S108 is equal to 2, as schematically shown in FIG. 4, wherein the value 2 was indicated at the second input of the selector 125);

the third corrected phase difference signal S143 when the logic circuit 116 is configured to generate the selection signal S108 indicating the selection of the third phase-shifted signal S103 (for example, when the signal S108 is equal to 3, as schematically shown in FIG. 4, wherein the value 3 was indicated at the third input of the selector 125);

the fourth corrected phase difference signal S144 when the logic circuit 116 is configured to generate the selection signal S108 indicating the selection of the fourth phase-shifted signal S104 (for example, when the signal S108 is equal to 4, as schematically shown in FIG. 4, wherein the value 4 was indicated at the fourth input of the selector 125).

The four adder/subtractor nodes 141, 142, 143, 144 have two input terminals and an output terminal and they are configured to provide a signal at the output terminal calculated as the difference between the signals at the two input terminals; the adder/subtractor nodes 141, 142, 143, 144 have the function of generating the signals S151, S152, S153, S154 respectively, wherefrom the first, the second, the third and the fourth estimation of the phase errors S131, S132, S133, S134 are updated. Moreover, by subtracting the corrected phase difference S120 and reduced by a suitable gain factor from the input signals at the accumulators 121, 122, 123, 124, the estimation and correction means 150 do not act on a constant component of the measured phase difference S122 not correlated to the phase selection signal S108. In particular:

node 141 is configured to receive (from the output terminal of the first selector 151) the first corrected phase difference signal S141, it is configured to receive the corrected phase difference signal S120 divided by 4 (indicated in FIG. 4 with the signal S161) and it is configured to provide the output signal S151 obtained from the difference between the first corrected phase difference signal S141 and the signal S161;

node 142 is configured to receive (from the output terminal of the selector 152) the second corrected phase difference signal S142, it is configured to receive the signal S161 and it is configured to provide the output signal S152 obtained from the difference between the second corrected phase difference signal S142 and the signal S161;

node 143 is configured to receive (from the output terminal of the selector 153) the third corrected phase difference signal S143, it is configured to receive the signal S161 and it is configured to provide the output signal S153 obtained from the difference between the third corrected phase difference signal S143 and the signal S161;

node 144 is configured to receive (from the output terminal of the selector 154) the fourth corrected phase difference signal S144, it is configured to receive the signal S161 and it is configured to provide the output signal S154 obtained from the difference between the fourth corrected phase difference signal S144 and the signal S161.

The division operation by four of the corrected phase difference signal S120 is schematically indicated in FIG. 4 by the gain block 171. More generally, a division by an integer M equal to the number of phases of the multi-phase generator 113 (four in the example in FIG. 4) is performed.

Preferably, the accumulators 121, 122, 123, 124 are digital filters, with the following transfer function in the zeta-transform domain: $1/(z-1)$. Consequently, the sample at the output of an accumulator at the instant n is equal to the sum of the sample at the input of the accumulator at the previous instant (n−1) and of the sample at the output of the accumulator at the previous instant (n−1).

It will be described hereinafter the operation of the frequency synthesizer 101 according to the embodiment of the disclosure shown in FIGS. 3 and 4, by referring also to the pattern of the signals in FIGS. 2, 5 and 6.

It is supposed that at the starting instant the frequency synthesizer 101 implemented with a phase-locked loop is locked, i.e. the phase detector 110 receives the reference signal S111 at frequency $f_r$ equal to the frequency $f_d$ of the divided signal S110. It is further supposed that the sequence of cyclic selection of the phase-shifted signals S101, S102, S103, S104 is {S101, S102, S103, S104}. In such assumption, the controlled oscillator 112 generates the synthesized signal S106 at a frequency $f_s$ which is a fractional multiple (N+¼) of the frequency $f_r$ of the reference signal S111.

The operation of the frequency synthesizer 101 at the instant k=1 will be described hereinafter.

The second phase-shifted signal S102 (phase-shifted by 90°) is affected by a phase error Δt (i.e. a phase shift of its phase of Δt), as shown in FIG. 2b regarding the phase φ=90°; the first signal (phase-shifted by 0°), the third signal (phase-shifted by 180°) and the fourth signal (phase-shifted by 270°), instead, are not affected by phase errors.

The parallel/serial phase selector 114 receives the four phase-shifted signals S101, S102, S103, S104 and generates therefrom the selected signal S107 by cyclically selecting among the signals S101, S102, S103, S104, as shown in FIG. 2b for the signal S10. At the instant k=1 the logic circuit 116 generates the selection signal S108 with value 1, thus the parallel/serial phase selector 114 selects the first phase-shifted signal S101.

The frequency divider 115 receives the selected signal S107 and generates therefrom the divided signal S110 at a frequency $f_d$ equal to the frequency $f_s$ of the signal S106 divided by a fractional number (N+k/4); it is observed that the divided signal S110 is affected by a phase error which is caused by the shift Δt of the edge of the pulses of the second phase-shifted signal S102.

It is supposed that the phase detector 110 is a time-digital converter. In such assumption, at the instant k=1 the phase detector 110 receives the divided signal S110 and the reference signal S111, it detects that there is a difference between the phase of the divided signal S110 and the phase of the reference signal S111 and it generates the sample of the measured phase difference signal S112 with a value equal to $(-\frac{1}{4})*\Delta t$: therefore $S112(k=1)=(-\frac{1}{4})*\Delta t$.

It is supposed that the estimation and correction means 150 are implemented digitally and in particular that the accumulators 121, 122, 123, 124 are digital filters. The estimation and correction means 150 receive at the instant k=1 at the first input terminal the phase difference signal $S112(k=1)=(-\frac{1}{4})*\Delta t$, at the second terminal the selection signal $S108(k=1)=1$ and generate at the output terminal the corrected phase difference signal $S120(k=1)$, as explained hereinafter.

It is supposed that at the instant k=1 the samples of the signals S131, S132, S133, S134 at the output of the first accumulator 121, of the second accumulator 122, of the third accumulator 123, of the fourth accumulator 124 respectively are 0, i.e. $S131(k=1)=S132(k=1)=S133(k=1)=S134(k=1)=0$.

Node 131 receives the sample of the signal S112 with value $(-\frac{1}{4})*\Delta t$, receives the sample of the signal S131 with value 0 and generates the sample of the signal S171 as the difference between the samples of the signal S112 and of the signal S131: therefore $S171(k=1)=S112(k=1)-S131(k=1)=(-\frac{1}{4})*\Delta t-0=(-\frac{1}{4})*\Delta t$.

The first parallel/serial selector 151 receives at the first input terminal the sample of the signal S171 with value $(-\frac{1}{4})*\Delta t$, at the second input terminal the sample with value zero, at the third input terminal the sample with value zero and at the fourth input terminal the sample with value zero, it receives the signal S108 with value 1 and thus it selects the sample of the signal at the first input, i.e. $S141(k=1)=S171(k=1)=(-\frac{1}{4})*\Delta t$.

The parallel/serial selectors 152, 153, 154 select the sample with value zero, of the signal at the fourth, third and second input respectively and thus $S142(k=1)=S143(k=1)=S144(k=1)=0$.

Therefore at the instant k=1 the value of the sample of the first corrected phase difference S141 is $(-\frac{1}{4})*\Delta t$.

The parallel/-to-serial phase selector 125 receives at the instant k=1 the sample of the first corrected phase difference signal S141 equal to $(-\frac{1}{4})*\Delta t$, the sample of the second corrected phase difference signal S142 equal to zero, the sample of the third corrected phase difference signal S143 equal to zero and the sample of the fourth corrected phase difference signal S144 equal to zero, it receives the selection signal S108 with value 1 and thus it selects the sample of the signal at the first input, i.e. $S120(k=1)=S141(k=1)=(-\frac{1}{4})*\Delta t$. Therefore at the instant k=1 the value of the sample of the corrected phase difference S120 is $(-\frac{1}{4})*\Delta t$ (as it is shown in FIG. 6).

The adder/subtractor node 141 receives the sample of the signal S141 with value $(-\frac{1}{4})*\Delta t$, receives the sample of the signal S161 with value $(-\frac{1}{16})*\Delta t$ obtained by dividing the corrected phase difference signal S120 by 4 and generates the signal S151. Therefore at the instant k=1 the value of the sample S151 is $(-\frac{1}{4})*\Delta t-(-\frac{1}{16})*\Delta t=(-\frac{3}{16})*\Delta t$.

The adder/subtractor nodes 142, 143, 144 receive the sample of the signals S142, S143, S144 with value 0 respectively, receive the sample of the signal S161 with value $(-\frac{1}{16})*\Delta t$ and generate the signals S152, S153, S154. Therefore at the instant k=1 the value of the samples S152, S153, S154 is $0-(-\frac{1}{16})*\Delta t=(\frac{1}{16})*\Delta t$.

The loop filter 111 is supposed to be a digital filter, for example the digital filter comprises an integrator and a zero which has the purpose to guarantee the stability of the phase-locked loop.

In the above case, at the instant k=1 the loop filter 111 receives the sample of the corrected phase difference signal S120 equal to the value $(-\frac{1}{4})*\Delta t$ and generates therefrom the first sample of the control signal S105: the value of the first sample of the control signal S105 at the instant k=1 is such to change the frequency $f_s$ generated by the controlled oscillator 112 in order to reduce the phase difference S112 measured by the phase detector 110 at instants subsequent to k=1.

The controlled oscillator 112 is supposed to allow a digital control of the generated synthesized frequency $f_s$. In the above case, at the instant k=1 the controlled oscillator 112 receives in input the first sample of the control signal S105 and generates at the output the synthesized signal S106 periodic with a period calculated as a function of the value of the first sample.

Therefore the feedback cycle at the instant k=1 ends with the multi-phase generator 113 which receives the synthesized signal S106. At the instant k=2 a similar operation occurs to the one described at the instant k=1: therefore it will be described hereinafter the operation of the frequency synthesizer 101 at the instant k=2, indicating only the most significant differences.

The logic circuit 116 generates the selection signal S108 with value 2, thus the parallel/serial phase selector 114 selects the second phase-shifted signal S102.

The phase detector 110 receives the divided signal S110 and the reference signal S111, detects that there is a difference between the phase of the divided signal S110 and the phase of the reference signal S111 and generates the sample of the measured phase difference signal S112 with a value equal to $(\frac{3}{4})*\Delta t$: therefore $S112(k=2)=(\frac{3}{4})*\Delta t$.

The accumulator 121 generates at the output the signal $S131(k=2)$ equal to the sum of the signal at its output at the previous instant $S131(k=1)$ and of the input signal at the previous instant $S151(k=1)$: therefore $S131(k=2)=S131(k=1)+S151(k=1)=0+(-\frac{3}{16})*\Delta t=(-\frac{3}{16})*\Delta t$. Therefore the first accumulator 121 has started to generate the estimation of the first phase error.

The accumulators 122, 123, 124 generate at the output the signals $S132(k=2), S133(k=2), S134(k=2)$ equal to the sum of the signals at their output at the previous instant $S132(k=1)$, $S133(k=1), S134(k=1)$ and of the signals at their input at the previous instant $S152(k=1), S153(k=1), S154(k=1)$: therefore $S132(k=2)=S133(k=2)=S134(k=2)=0+(\frac{1}{16})*\Delta t=(\frac{1}{16})*\Delta t$. Therefore the accumulators 122, 123, 124 have started to generate the estimation of the first error phase.

Node 132 receives the sample of the signal S112 with value $(\frac{3}{4})*\Delta t$, receives the sample of the signal S132 with value $(\frac{1}{16})*\Delta t$ and generates the sample of the signal S172 as the difference between the samples of the signal S112 and the signal S132: therefore $S172(k=2)=S112(k=2)-S132(k=2)=(\frac{3}{4})*\Delta t-(\frac{1}{16})*\Delta t=(\frac{11}{16})*\Delta t$.

The parallel/serial selector 152 receives at the first input terminal the sample of the signal S172 with value $(\frac{11}{16})*\Delta t$, at the second input terminal the sample with value zero, at the third input terminal the sample with value zero and at the fourth input terminal the sample with value zero, receives the signal S108 with value 2 and thus it selects the sample of the signal at the first input, i.e. $S142(k=2)=S172(k=2)=(\frac{11}{16})*\Delta t$.

The parallel/serial selectors 151, 153, 154 select the sample with value zero of the signal at the second, fourth and third inputs respectively and thus $S141(k=2)=S143(k=2)=S144(k=2)=0$.

Therefore at the instant k=2 the value of the sample at the second corrected phase difference S142 is $(\frac{11}{16})*\Delta t$.

The parallel/serial phase selector 125 receives at the instant k=2 the sample of the first corrected phase difference signal S141 equal to zero, the sample of the second corrected phase difference signal S142 equal to $(\frac{11}{16})*\Delta t$, the sample of the third corrected phase difference signal S143 equal to zero and the sample of the fourth corrected phase difference signal S144 equal to zero, receives the selection signal S108 with value 2 and thus it selects the sample of the signal at the second input, i.e. $S120(k=2)=S142(k=2)=(11/16)*\Delta t$.

Therefore at the instant k=2 the value of the sample of the corrected phase difference S120 is $(11/16)*\Delta t$.

The adder/subtractor node 142 receives the sample of the signal S142 with value $(11/16)*\Delta t$, receives the sample of the signal S161 with value $[(11/16)/4]*\Delta t=(11/64)*\Delta t$ and generates the signal S152. Therefore at the instant k=2 the value of the sample S152 is $(11/16)*\Delta t-(11/64)*\Delta t=(33/64)*\Delta t$.

The adder/subtractor nodes 141, 143, 144 receive the sample of the signals S141, S142, S144 with value 0 respectively, receive the sample of the signal S161 with value $(11/64)*\Delta t$ and generate the signals S151, S153, S154. Therefore at the instant k=2 the value of the samples S151, S153, S154 is $0-(11/64)*\Delta t=-(11/64)*\Delta t$.

At the instant k=2 the loop filter 111 receives the sample of the corrected phase difference signal S120 equal to the value $(11/16)*\Delta t$ and generates therefrom the second sample of the control signal S105: the value of the second sample of the control signal S105 at the instant k=2 is such to change the generated frequency $f_s$ of the controlled oscillator 112 in order to reduce the phase difference S112 measured by the phase detector 110 at instants after k=2.

The controlled oscillator 112 receives in input the second sample of the signal S105 and generates at the output the synthesized signal S106 periodic with a period calculated as a function of the value of the second sample.

Therefore the feedback cycle at instant k=2 ends with the multi-phase generator 113 which receives the synthesized signal S106.

At the instant k=3 the feedback cycle has a operation similar to the one described at the instant k=2: therefore it will be described hereinafter the operation of the frequency synthesizer 101 at the instant k=3, indicating only the most significant differences.

The logic circuit 116 generates the selection signal S108 with value 3, thus the parallel/serial phase selector 114 selects the third phase-shifted signal S103.

The phase detector 110 receives the divided signal S110 and the reference signal S111, detects that there is a difference between the phase of the divided signal S110 and the phase of the reference signal S111 and generates the sample of the measured phase difference signal S112 with a value equal to $(-1/4)*\Delta$: therefore $S112(k=3)=(-1/4)*\Delta t$.

The accumulator 121 generates at the output the signal $S131(k=3)$ equal to the sum of the signal at its output at the previous instant $S131(k=2)$ and of the signal in input at the previous instant $S151(k=2)$: therefore $S131(k=3)=(-3/16)*\Delta t+(-11/64)*\Delta t=(-23/64)*\Delta t$.

The accumulator 122 generates at the output the signal $S132(k=3)$ equal to the sum of the signal at its output at the previous instant $S132(k=2)$ and of the signal in input at the previous instant $S152(k=2)$: therefore $S132(k=3)=(1/16)*\Delta t+(33/64)*\Delta t=(37/64)*\Delta t$.

The accumulators 123, 124 generate at the output the signals $S133(k=3)$, $S134(k=3)$ equal to the sum of the signals at their output at the previous instants $S133(k=2)$, $S134(k=2)$ and of the signals at their input at the previous instant S153 $(k=2)$, $S154(k=2)$: therefore $S133(k=3)=S134(k=3)=(1/16)*\Delta t+(-11/64)*\Delta t=(-7/64)*\Delta t$.

The node 133 receives the sample of the signal S112 with value $(-1/4)*\Delta t$, receives the sample of the signal S133 with value $(-7/64)*\Delta t$ and generates the sample of the signal S173 as the difference between the samples of the signal S112 and of the signal S133: therefore $S173(k=3)=S112(k=3)-S133(k=3)=(-1/4)*\Delta t-(-7/64)*\Delta t=(-9/64)*\Delta t$.

The third parallel/serial selector 153 receives at the first input terminal the sample of the signal S173 with value $(-9/64)*\Delta t$, at the second input terminal the sample with value zero, at the third input terminal the sample with value zero and at the fourth input terminal the sample with value zero, receives the signal S108 with value 3 and thus it selects the sample of the signal at the first input, i.e. $S143(k=3)=S173(k=3)=(-9/64)*\Delta t$.

The parallel/serial selectors 151, 152, 154 select the sample with value zero of the signal at the third, second, fourth inputs respectively and thus $S141(k=3)=S142(k=3)=S144(k=3)=0$.

Therefore at the instant k=3 the value of the sample of the third corrected phase difference S143 is $(9/64)*\Delta t$.

The parallel/serial phase selector 125 receives at the instant k=3 the sample of the first corrected phase difference signal S141 equal to zero, the sample of the second corrected phase difference signal S142 equal to zero, the sample of the third corrected phase difference signal S143 equal to $(-9/64)*\Delta t$ and the sample of the fourth corrected phase difference signal S144 equal to zero, receives the selection signal S108 with value 3 and thus it selects the sample of the signal at the third input, i.e. $S120(k=3)=S143(k=3)=(-9/64)*\Delta t$. Therefore at the instant k=3 the value of the sample of the corrected phase difference S120 is $(-9/64)*\Delta t$.

The adder/subtractor node 143 receives the sample of the signal S143 with value $(-9/64)*\Delta t$, receives the sample of the signal S161 with value $[(9/64)/4]*\Delta t=(-9/256)*\Delta t$ and generates the signal S153. Therefore at the instant k=3 the value of the sample S153 is $(-9/64)*\Delta t-(-9/256)*\Delta t=-(27/256)*\Delta t$.

The adder/subtractor nodes 141, 142, 144 receive the sample of signals S141, S142, S144 with value 0 respectively, receive the sample of the signal S161 with value $(-9/256)*\Delta t$ and generate signals S151, S152, S154. Therefore at the instant k=3 the value of the samples S151, S152, S154 is $0-(-9/256)*\Delta t=(9/256)*\Delta t$.

At the instant k=3 the loop filter 111 receives the sample of the corrected phase difference signal S120 equal to value $(-9/64)*\Delta t$ and generates therefrom the third sample of the control signal S105: the value of the third sample of the control signal S105 at the instant k=3 is such to change the generated frequency $f_s$ of the controlled oscillator 112 in order to reduce the phase difference S112 measured by the phase detector 110 at instants after k=3.

The controlled oscillator 112 receives in input the third sample of the signal S105 and generates at the output the synthesized signal S106 periodic with a period calculated as a function of the value of the third sample.

Therefore the feedback cycle at instant k=3 ends with the multi-phase generator 113 which receives the synthesized signal S106.

At the instant k=4 the feedback cycle has a operation similar to the one described at the instant k=3: therefore it will be described hereinafter the operation of the frequency synthesizer 101 at the instant k=4, indicating only the most significant differences.

The logic circuit 116 generates the selection signal S108 with value 4, thus the parallel/serial phase selector 114 selects the fourth phase-shifted signal S104.

The phase detector 110 receives the divided signal S110 and the reference signal S111, detects that there is a difference between the phase of the divided signal S110 and the phase of the reference signal S111 and generates the sample of the measured phase difference signal S112 with a value equal to $(-1/4)*\Delta t$: therefore $S112(k=4)=(-1/4)*\Delta t$.

The accumulator 121 generates at the output the signal $S131(k=4)$ equal to the sum of the signal at its output at the previous instant S131($k=3$) and of the input signal at the previous instant S151($k=3$): therefore S131($k=4$)=$(-^{23}/_{64})*\Delta t+(^{9}/_{256})*\Delta t=(-^{83}/_{256})*\Delta t$.

The accumulator 122 generates at the output the signal S132($k=4$) equal to the sum of the signal at its output at the previous instant S132($k=3$) and of the input signal at the previous instant S152($k=3$): therefore S132($k=4$)=$(^{37}/_{64})*\Delta t+(^{9}/_{256})*\Delta t=(^{157}/_{256})*\Delta t$.

The accumulator 123 generates the output signal S133 ($k=4$) equal to the sum of the signal at their output at the previous instant S133($k=3$) and of the input signal at their input at the previous instant S153($k=3$): therefore S133($k=4$) =$(-^{7}/_{64})*\Delta t+(-^{27}/_{256})*\Delta t=(-^{55}/_{256})*\Delta t$.

The accumulator 124 generates at the output the signal S134($k=3$) equal to the sum of the signal at its output at the previous instant S134($k=3$) and of the input signal at the previous instant S154($k=3$): therefore S134($k=4$)=$(-^{7}/_{64})*\Delta t+(^{9}/_{256})*\Delta t=(-^{19}/_{256})*\Delta t$.

The node 134 receives the sample of the signal S112 with value $(-¼)*\Delta t$, receives the sample of the signal S134 with value $(-^{19}/_{256})*\Delta t$ and generates the sample of the signal S174 as the difference between the samples of the signal S112 and of the signal S134: therefore S174($k=4$)=S112($k=4$)−S134 ($k=4$)=$(-¼)*\Delta t-(-^{19}/_{256})*\Delta t=(-^{45}/_{256})*\Delta t$.

The fourth parallel/serial selector 154 receives at the first input terminal the sample of the signal S174 with value $(-^{45}/_{256})*\Delta t$, at the second input terminal the sample with value zero, at the third input terminal the sample with value zero and at the fourth input terminal the sample with value zero, receives the signal S108 with value 4 and therefore it selects the sample of the signal at the first input, i.e. S144 ($k=4$)=S174($k=4$)=$(-^{45}/_{256})*\Delta t$.

The parallel/serial selectors 151, 152, 153 select the sample with value zero of the signal at the fourth, third, second, inputs respectively and thus S141($k=4$)=S142($k=4$) =S143($k=4$)=0.

Therefore at the instant $k=4$ the value of the sample of the fourth corrected phase difference S144 is $(-^{45}/_{256})*\Delta t$.

The parallel/serial phase selector 125 receives at the instant $k=4$ the sample of the first corrected phase difference signal S141 equal to zero, the sample of the second corrected phase difference signal S142 equal to zero, the sample of the third corrected phase difference signal S143 equal to zero and sample of the fourth corrected phase difference signal S144 equal to $(-^{45}/_{256})*\Delta t$, receives the selection signal S108 with value 4 and thus it selects the sample of the signal at the third input, i.e. S120($k=4$)=S144($k=4$)=$(-^{45}/_{256})*\Delta t$. Therefore at the instant $k=4$ the value of the sample of the corrected phase difference S120 is $(-^{45}/_{256})*\Delta t$.

The adder/subtractor node 144 receives the sample of the signal S144 with value $(-^{45}/_{256})*\Delta t$, receives the sample of signal S161 with value $[(-^{45}/_{256})/4]*\Delta t=(-^{45}/_{1024})*\Delta t$ and generates the signal S154. Therefore at the instant $k=$, the value of the sample S154 is $(-^{45}/_{256})*\Delta t-(-^{45}/_{1024})*\Delta t=(^{135}/_{1024})*\Delta t$.

The adder/subtractor nodes 141, 142, 143 receive the sample of the signals S141, S142, S143 with value respectively, receive the sample of signal S161 with value $(-^{45}/_{1024})*\Delta t$ and generate the signals S151, S152, S153. Therefore at the instant $k=4$ the value of the samples S151, S152, S153 is $0-(-^{45}/_{1024})*\Delta t=(^{45}/_{1024})*\Delta t$.

At the instant $k=4$ the loop filter 111 receives the sample of the corrected phase difference signal S120 equal to the value $(-^{45}/_{256})*\Delta t$ and generates therefrom the fourth sample of the control signal S105: the value of the fourth sample of the control signal S105 at the instant $k=4$ is such to change the frequency $f_s$ generated by the controlled oscillator 112 in order to reduce the phase difference S112 measured by the phase detector 110 at instants after $k=4$.

The controlled oscillator 112 receives in input the fourth sample of the signal S105 and generates at the output the synthesized signal S106 periodic with a period calculated as a function of the value of the fourth sample.

The feedback cycle at the instant $k=4$ thus ends with the multi-phase generator 113 which receives the synthesized signal S106.

The operation of the frequency synthesizer 101 continues at the subsequent instants $k=5, 6, 7, 8, \ldots$, analogously to what explained above. After some time instants (for example $k=6$), the operation of the synthesizer 101 reaches the steady condition. In fact, the following behaviour may be observed:

the samples of the first estimation of the phase error S131 reach the steady value $(-¼)*\Delta t$;

the samples of the second estimation of the phase error S132 reach the steady value $(¾)*\Delta t$;

the samples of the third estimation of the phase error S133 reach the steady value $(-¼)*\Delta t$;

the samples of the fourth estimation of the phase error S134 reach the steady value $(-¼)*\Delta t$.

Moreover, it can observed that the corrected phase difference signal S120 reaches, when at steady condition, the value zero: therefore the estimation and correction means 150 have eliminated the effect caused by the phase error $\Delta t$ of the second phase-shifted signal S102.

Alternatively, the estimation and correction means 150 are implemented with analog devices.

Figure 7A:
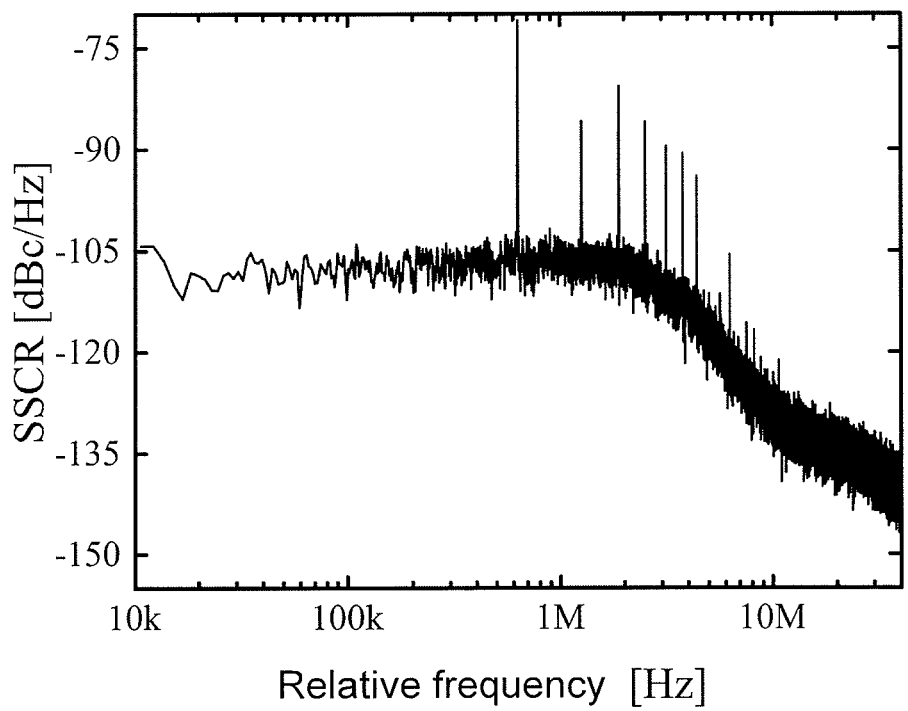
FIG. 7 schematically shows a comparison between the frequency synthesizer according to the prior art and the disclosure.
Figure 7B:
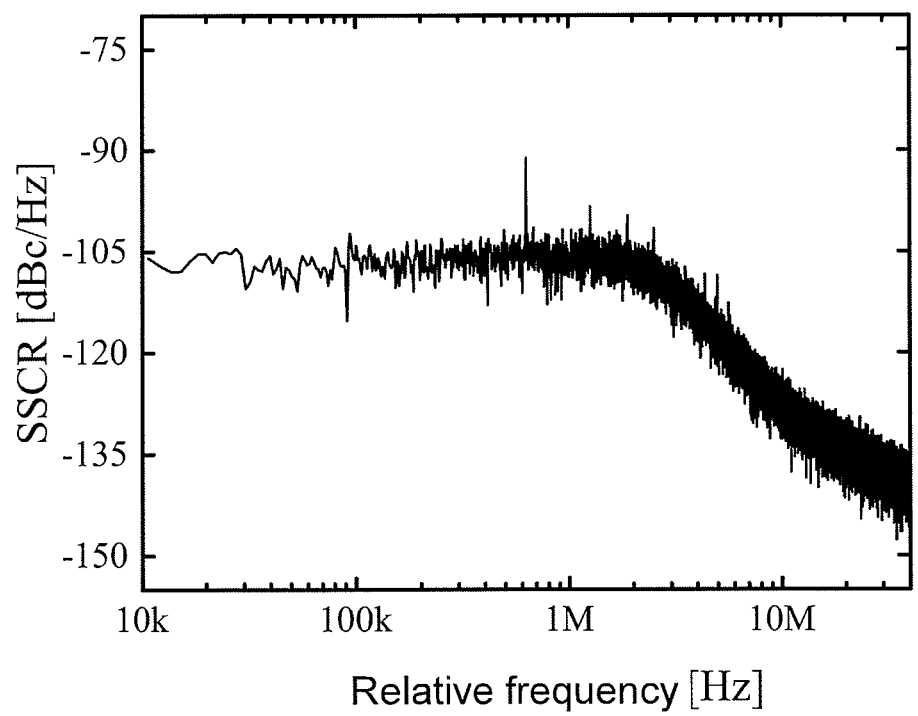

FIG. 7 schematically shows a comparison between an exemplary pattern of the phase noise in a single sideband of the frequency synthesizer 1 according to the prior art and an exemplary pattern of the phase noise in a single sideband of the frequency synthesizer 101 according to the embodiment of the disclosure, as a function of the relative frequency (on the axis of abscissas, in a logarithmic scale), i.e. as a function of the distance from the carrier frequency.

It is known that the phase noise in a single sideband is defined as the ratio between the noise power in a sideband (typically, 1 Hz) at a certain distance from the carrier frequency and the power of the carrier, and it is measured in dBc/Hz; in english it is referred to as the Single Sideband to Carrier Ratio (SSCR). The carrier frequency is the frequency $f_1$ of signal S6 in case of the frequency synthesizer 1 according to the prior art, while the carrier frequency is the frequency $f_s$ of the synthesized signal S106 in case of the frequency synthesizer 101 according to the embodiment of the disclosure.

In particular, FIG. 7a shows an example of the pattern of the single sideband SSCR phase noise according to the prior art and FIG. 7a shows an example of the pattern of the single sideband SSCR phase noise according to the embodiment of the disclosure. It may be observed that the single sideband SSCR phase noise according to the prior art has peaks at the fractional spurious frequencies. On the contrary, it may observed that the single sideband SSCR phase noise according to the embodiment of the disclosure has no peaks at some fractional spurious frequencies and has very small peaks at some other fractional spurious frequencies: therefore it is evident that in the frequency synthesizer 101 according to the disclosure the single sideband SSCR phase noise is greatly reduced (possibly, also cancelled).

The various embodiments described above can be combined to provide further embodiments. All of the U.S. patents, U.S. patent application publications, U.S. patent application, foreign patents, foreign patent application and non-patent publications referred to in this specification are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device for generating a fractional synthesized frequency, the device comprising:
   a multi-phase controlled oscillator configured to generate, from a control signal, a plurality of signals phase-shifted each other;
   a difference phase detector configured to receive a selected signal from the plurality of phase-shifted signals, to receive a reference signal and to measure a difference between a phase of the selected signal and a phase of the reference signal;
   wherein the device further comprises:
   an estimation and correction module configured to receive the measured phase difference and estimate a phase error affecting the generation of at least one of the plurality of phase-shifted signals, and configured to generate a corrected measure of the phase difference taking into account the estimated phase error; and
   a filter configured to receive the corrected measure of the phase difference and to generate therefrom the control signal to be provided to the multi-phase controlled oscillator.

2. An electronic device according to claim 1, wherein the difference phase detector and the estimation and correction module are digital, the estimation and correction module further comprising:
   a plurality of accumulators for providing a plurality of phase error signals indicating the estimation of the phase error affecting the generation of the at least one of the plurality of phase-shifted signals;
   a first plurality of adders/subtractors for receiving the measured phase difference and the plurality of estimated phase error signals and for providing a plurality of difference signals calculated by subtracting the plurality of estimated phase error signals from the measured phase difference;
   a plurality of parallel-to-serial selectors for receiving the plurality of difference signals and for providing a plurality of corrected phase difference signals selected from the plurality of difference signals according to a selection signal;
   a parallel-to-serial phase selector for receiving the plurality of corrected phase difference signals and for providing the corrected measure of the phase difference selected from the plurality of corrected phase difference signals according to the selection signal.

3. An electronic device according to claim 2, wherein the plurality of accumulators have the following transfer function in the Z-transform domain: $1/(z-1)$.

4. An electronic device according to claim 3, further including a second plurality of adders/subtractors for receiving the plurality of corrected phase difference signals and the corrected measure of the phase difference divided by the number of the plurality of phase-shifted signals and for providing to the input terminals of the first plurality of adders/subtractors a plurality of signals calculated by subtracting the divided corrected measure of the phase difference from the plurality of corrected phase difference signals.

5. An electronic device according to claim 4, wherein the difference phase detector is a time to digital converter.

6. An electronic device according to claim 5, further comprising a parallel-to-serial phase-selector for generating the selected signal by selecting cyclically at least part of the plurality of phase-shifted signals.

7. An electronic device according to claim 6, the multi-phase controlled oscillator comprising:
   a controlled oscillator configured to generate a synthesized signal having the fractional synthesized frequency, according to the control signal;
   a generator, from the synthesized signal, of the plurality of phase-shifted signals.

8. An electronic device according to claim 7, further comprising a frequency divider connected between the parallel-to-serial phase selector and the difference phase detector for receiving the selected signal and providing to the difference phase detector a divided signal having a frequency divided by an integer value respect to the frequency of the selected signal.

9. An electronic device according to claim 8, wherein the multi-phase controlled oscillator is configured to generate the synthesized frequency variable according to a voltage control signal or according to a digital control signal.

10. An electronic device according to claim 9, further including a logic circuit for controlling the selection of the selected signal from the plurality of phase-shifted signals and for generating the selection signal.

11. A radio transmitter comprising an electronic device, said electronic device comprising:
    a multi-phase controlled oscillator configured to generate, from a control signal, a plurality of signals phase-shifted each other;
    a difference phase detector configured to receive a selected signal from the plurality of phase-shifted signals, to receive a reference signal and to measure a difference between a phase of the selected signal and a phase of the reference signal;
    wherein the electronic device further comprises:
    an estimation and correction module configured to receive the measured phase difference and estimate a phase error affecting the generation of at least one of the plurality of phase-shifted signals, and configured to generate a corrected measure of the phase difference taking into account the estimated phase error; and
    a filter configured to receive the corrected measure of the phase difference and to generate therefrom the control signal to be provided to the multi-phase controlled oscillator.

12. A radio transmitter according to claim 11, wherein the difference phase detector and the estimation and correction module are digital, the estimation and correction module including:
    a plurality of accumulators for providing a plurality of phase error signals indicating the estimation of the phase error affecting the generation of the at least one of the plurality of phase-shifted signals;
    a first plurality of adders/subtractors for receiving the measured phase difference and the plurality of estimated phase error signals and for providing a plurality of difference signals calculated by subtracting the plurality of estimated phase error signals from the measured phase difference;

a plurality of parallel-to-serial selectors for receiving the plurality of difference signals and for providing a plurality of corrected phase difference signals selected from the plurality of difference signals according to a selection signal;

a parallel-to-serial phase selector for receiving the plurality of corrected phase difference signals and for providing the corrected measure of the phase difference selected from the plurality of corrected phase difference signals according to the selection signal.

13. A radio transmitter according to claim 12, wherein the plurality of accumulators have the following transfer function in the Z-transform domain: $1/(z-1)$.

14. A radio transmitter according to claim 13, wherein the electronic device further includes a second plurality of adders/subtractors for receiving the plurality of corrected phase difference signals and the corrected measure of the phase difference divided by the number of the plurality of phase-shifted signals and for providing to the input terminals of the first plurality of adders/subtractors a plurality of signals calculated by subtracting the divided corrected measure of the phase difference from the plurality of corrected phase difference signals.

15. A radio receiver comprising an electronic device, said electronic device comprising:

a multi-phase controlled oscillator configured to generate, from a control signal, a plurality of signals phase-shifted each other;

a difference phase detector configured to receive a selected signal from the plurality of phase-shifted signals, to receive a reference signal and to measure a difference between a phase of the selected signal and a phase of the reference signal;

wherein the electronic device further comprises:

an estimation and correction module configured to receive the measured phase difference and estimate a phase error affecting the generation of at least one of the plurality of phase-shifted signals, and configured to generate a corrected measure of the phase difference taking into account the estimated phase error; and a filter configured to receive the corrected measure of the phase difference and to generate therefrom the control signal to be provided to the multi-phase controlled oscillator.

16. A radio receiver according to claim 15, wherein the difference phase detector and the estimation and correction module are digital, the estimation and correction module includes:

a plurality of accumulators for providing a plurality of phase error signals indicating the estimation of the phase error affecting the generation of the at least one of the plurality of phase-shifted signals;

a first plurality of adders/subtractors for receiving the measured phase difference and the plurality of estimated phase error signals and for providing a plurality of difference signals calculated by subtracting the plurality of estimated phase error signals from the measured phase difference;

a plurality of parallel-to-serial selectors for receiving the plurality of difference signals and for providing a plurality of corrected phase difference signals selected from the plurality of difference signals according to a selection signal;

a parallel-to-serial phase selector for receiving the plurality of corrected phase difference signals and for providing the corrected measure of the phase difference selected from the plurality of corrected phase difference signals according to the selection signal.

17. A radio receiver according to claim 16, wherein the plurality of accumulators have the following transfer function in the Z-transform domain: $1/(z-1)$.

18. A radio receiver according to claim 17, wherein the electronic device further includes a second plurality of adders/subtractors for receiving the plurality of corrected phase difference signals and the corrected measure of the phase difference divided by the number of the plurality of phase-shifted signals and for providing to the input terminals of the first plurality of adders/subtractors a plurality of signals calculated by subtracting the divided corrected measure of the phase difference from the plurality of corrected phase difference signals.

* * * * *